United States Patent
Lai et al.

(10) Patent No.: US 9,461,063 B1
(45) Date of Patent: Oct. 4, 2016

(54) METHOD FOR FORMING A SEMICONDUCTOR STRUCTURE

(71) Applicant: MACRONIX INTERNATIONAL CO., LTD., Hsinchu (TW)

(72) Inventors: Erh-Kun Lai, Taichung (TW); Chun-Min Cheng, Hsinchu (TW); Kuang-Hao Chiang, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/705,169

(22) Filed: May 6, 2015

(51) Int. Cl.
   *H01L 27/115* (2006.01)
   *H01L 21/311* (2006.01)
   *H01L 21/3213* (2006.01)

(52) U.S. Cl.
   CPC .... *H01L 27/11582* (2013.01); *H01L 21/31111* (2013.01); *H01L 21/31116* (2013.01); *H01L 21/31144* (2013.01); *H01L 21/32133* (2013.01); *H01L 21/32139* (2013.01)

(58) Field of Classification Search
   CPC .................................................. H01L 27/11582
   See application file for complete search history.

(56) References Cited

U.S. PATENT DOCUMENTS

| | | | |
|---|---|---|---|
| 7,902,075 B2 | 3/2011 | Grivna et al. | |
| 8,227,897 B2* | 7/2012 | Kim | H01L 23/5228 257/536 |
| 8,405,141 B2* | 3/2013 | Matsuda | H01L 27/11573 257/324 |
| 8,809,938 B2* | 8/2014 | Hwang | H01L 27/11565 257/324 |
| 8,907,382 B2 | 12/2014 | Chang | |
| 8,946,807 B2 | 2/2015 | Hopkins et al. | |
| 2008/0220617 A1* | 9/2008 | Turner | H01L 21/76283 438/758 |
| 2009/0230449 A1* | 9/2009 | Sakaguchi | H01L 27/0688 257/298 |
| 2010/0213526 A1* | 8/2010 | Wada | H01L 21/76808 257/314 |
| 2010/0320526 A1* | 12/2010 | Kidoh | H01L 23/522 257/324 |
| 2012/0238093 A1* | 9/2012 | Park | H01L 21/76838 438/675 |
| 2013/0228739 A1* | 9/2013 | Sasago | H01L 27/0688 257/4 |

FOREIGN PATENT DOCUMENTS

| | | |
|---|---|---|
| TW | 201001619 A | 1/2010 |
| TW | 201011859 A1 | 3/2010 |
| TW | 201442211 A | 11/2014 |

OTHER PUBLICATIONS

TIPO Office Action dated Jun. 3, 2016 in Taiwan application (No. 104115004).

* cited by examiner

*Primary Examiner* — Lex Malsawma
(74) *Attorney, Agent, or Firm* — McClure, Qualey & Rodack, LLP

(57) ABSTRACT

A method for forming a semiconductor structure is provided. The method includes following steps. First, a stack of alternate conductive layers and insulating layers is formed on a buffer layer on a buried layer. Next, a first opening is formed through the stack and through a portion of the buffer layer. Thereafter, a spacer is formed on a sidewall of the first opening.

15 Claims, 6 Drawing Sheets

METHOD FOR FORMING A SEMICONDUCTOR STRUCTURE

BACKGROUND

1. Technical Field

The disclosure relates to a method for forming a semiconductor structure, and more particularly to a method for forming a spacer on a sidewall of an opening in the semiconductor structure.

2. Description of the Related Art

Recently, various three dimensional (3D) memory devices, such as a single gate vertical-channel (SGVC) 3D NAND memory device that has a multi-layer stack structure, have been provided due to the rising demand for superior memory. Such a 3D memory device may possess a higher density memory and excellent electrical characteristics, such as the reliability in data storage and a high operating speed.

In a U turn type SGVC 3D NAND memory device, an inversion gate is used for control assistance. However, during the manufacturing of the inversion gate, over-etching may be occurred, and the structure of the memory device may be damaged. As such, it is relevant to improve the methods for forming the inversion gate in the memory device.

SUMMARY

In this disclosure, a method for forming a semiconductor structure is provided in order to solve at least some of the problems described above.

According to one embodiment, a method for forming a semiconductor structure comprises the following steps. First, a stack of alternate conductive layers and insulating layers is formed on a buffer layer on a buried layer. Next, a first opening is formed through the stack and through a portion of the buffer layer. Thereafter, a spacer is formed on a sidewall of the first opening.

Figure 1A:
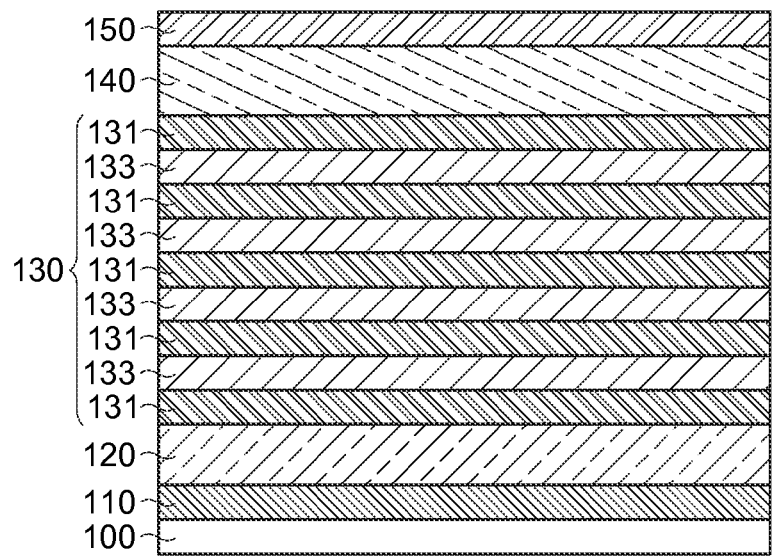
FIG. 1A to FIG. 1E schematically illustrate a method for manufacturing a semiconductor structure according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Now the description is directed to the method for manufacturing a semiconductor structure. For purposes of explanation, the following embodiments will be exemplarily focused on a 3D memory device, such as a 3D vertical channel memory device, in particular a U turn type of a SGVC 3D NAND memory device. However, this invention is not limited thereto. For example, the method may be applied in other non-volatile memory, general memory, or general semiconductor structures.

FIG. 1A to FIG. 1E schematically illustrate a method for manufacturing a semiconductor structure according to one embodiment of the present disclosure.

Referring to FIG. 1A, a substrate 100 is provided with layers and/or devices optionally formed thereon. A buried layer 110 may be formed on the substrate 100. A buffer layer 120 may be formed on the buried layer 110. A stack 130 of alternate insulating layers 131 and conductive layers 133 is formed on the buffer layer 120. In one embodiment, both of the top layer and the bottom layer of the stack 130 are insulating layers 131.

The buried layer 110 and the insulating layers 131 may be formed of oxide. The thickness of each insulating layer 131 may be, for example, 200 Å. The buffer layer 120 may be formed of a conductive semiconductor material, such as n-type doped (e.g. phosphorus or arsenic doped) or p-type doped (e.g. boron doped) poly-silicon. The conductive layers 133 may be formed of a conductive semiconductor material, such as p-type doped poly-silicon, doped with boron. The buffer layer 120 may have a thickness greater than each conductive layer 133. In one embodiment, the thickness of the buffer layer 120 may be in the range of 1500 Å to 2000 Å, and the thickness of each conductive layer 133 may be 400 Å. The conductive layers 133 may be used as the word lines and the ground select line in the semiconductor structure.

Optionally, a first hard mask layer 140 may be formed on the stack 130, and a second hard mask layer 150 may be formed on the first hard mask layer 140. The first hard mask layer 140 may be formed of SiN. The first hard mask layer 140 may be used to protect a semiconductor structure from bending or collapse, and/or may be functioned as a stopping layer for a chemical mechanical polishing (CMP) step. The second hard mask layer 150 may be formed of oxide, and may be used to protect the first hard mask layer 140 during following treatment, such as applying a second etchant (as illustrated in FIG. 1E).

Figure 1B:
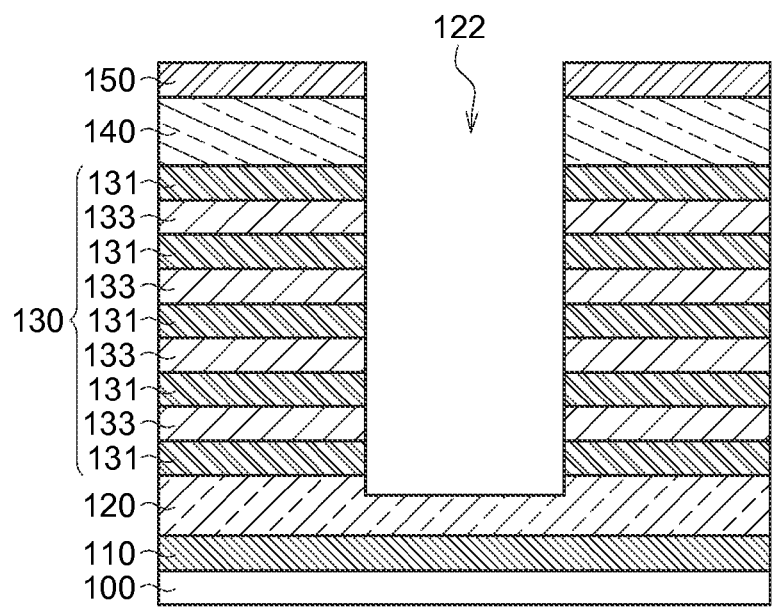
Figure 1C:
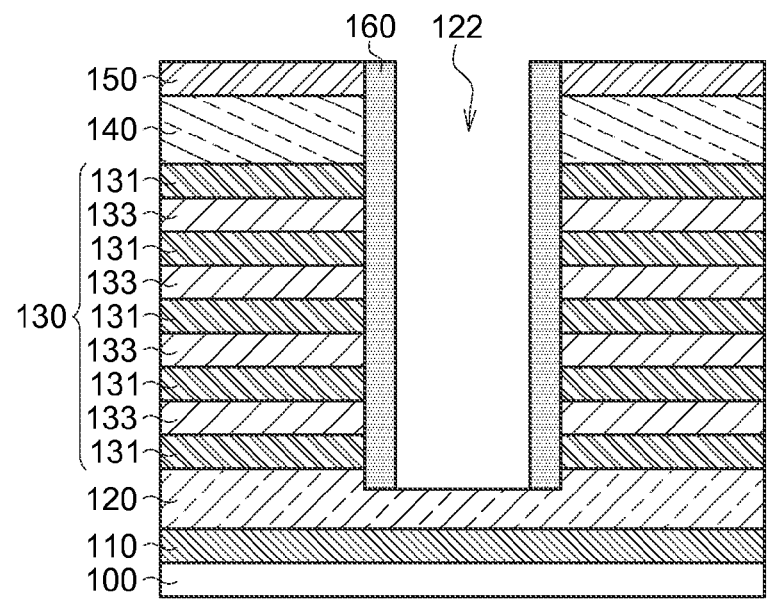

Referring to FIG. 1B, a first opening 122 may be formed through the stack 130 and through a portion of the buffer layer 120. The first opening 122 is stopped on the buffer layer 120, and the remaining portion of the buffer layer 120 still covers the buried layer 110. That is, the surface of the buried layer 110 is not exposed. The forming of the first opening 122 may be used for word lines patterning. Further, the first opening 122 may also be formed through the first hard mask layer 140 and the second hard mask layer 150. The first opening 122 may be formed by an etching process.

Referring to FIG. 1O, a spacer 160 may be formed on a sidewall of the first opening 122. The thickness of the spacer 160 may be in the range of 300 Å to 400 Å. The materials of the spacer 160 may be SiN, SiGe or Ge. In one embodiment, the spacer 160 may be formed by a deposition process, and an etching process may be conducted after the deposition process. In the etching process, the etching may be through the deposited materials and stop on the second hard mask layer 150 and the buffer layer 120, to form the spacer 160.

Figure 1D:
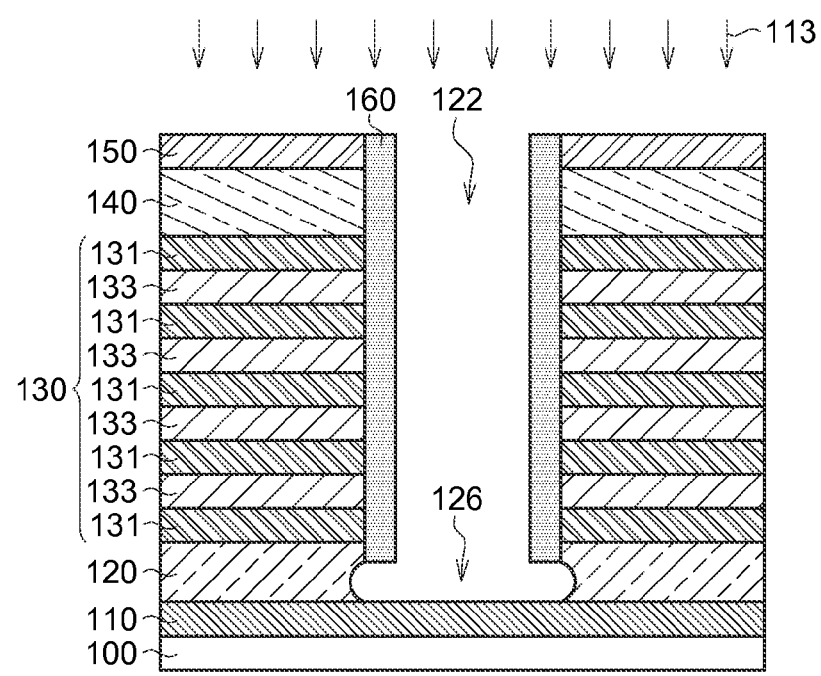
Figure 1E:
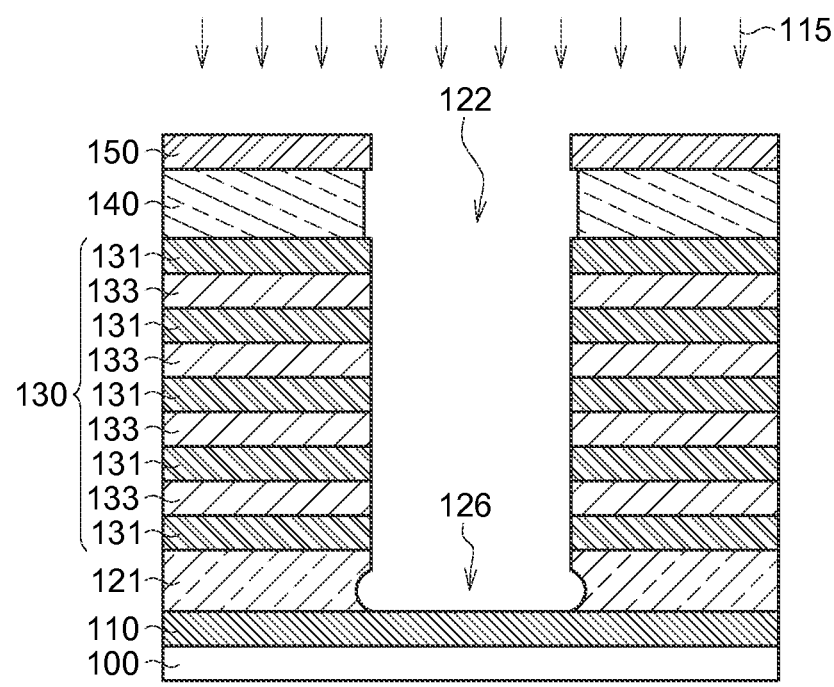

Referring to FIG. 1D, a first etchant 113 may be applied to form a second opening 126 stopped on the buried layer 110. After forming the second opening 126, the buffer layer 120 may become separating inversion gates 121. The second opening 126 may be formed by wet etching using the first etchant 113. The first etchant 113 may include ammonium (NH$_4$OH) or tetramethylammonium hydroxide (TMAH), such as a dilute ammonium solution or a dilute tetramethylammonium hydroxide solution. The first etchant 113 has a first etching rate and a second etching rate to the buried layer 110 and the buffer layer 120, respectively, and the second etching rate is higher than the first etching rate. In one embodiment, the second etching rate is much higher than the first etching rate, so the first etchant 113 may selectively etch the buffer layer 120 while remaining the buried layer 110 almost intact.

Referring to FIG. 1E, a second etchant 115 may be applied to remove the spacer 160. In some cases, the first hard mask layer 140 may be undercut a little bit by the second etchant 115. The second etchant 115 may be $H_3PO_4$, such as hot $H_3PO_4$.

After removing the spacer 160, memory layers (not shown) may be formed on the sidewall of the first opening 122 and the second opening 126. The memory layers may have an oxide-nitride-oxide (ONO) structure or an oxide-nitride-oxide-nitride-oxide (ONONO) structure. Then, a conductor (not shown) may be formed on the memory layer so as to form a channel layer. The conductor may be poly-silicon or other suitable channel material. After that, a chemical mechanical polishing (CMP) process may be optionally carried out. The CMP process is conducted to remove the superfluous material for forming the memory layers (not shown) and the conductor (not shown), and is stopped on the first hard mask layer 140. In this case, the first hard mask layer 140 may be functioned as a stopping layer for the CMP process. The first hard mask layer 140 and the second hard mask layer 150 may be removed after the CMP process.

FIG. 2A to FIG. 2F schematically illustrate a method for manufacturing a semiconductor structure according to another embodiment of the present disclosure. This embodiment is different from the embodiment shown in FIG. 1A to FIG. 1E in the spacer 260 and the step of adding an etching process 211 before applying the first etchant 113. Thus, the similarities may not be repeated here.

Figure 2A:
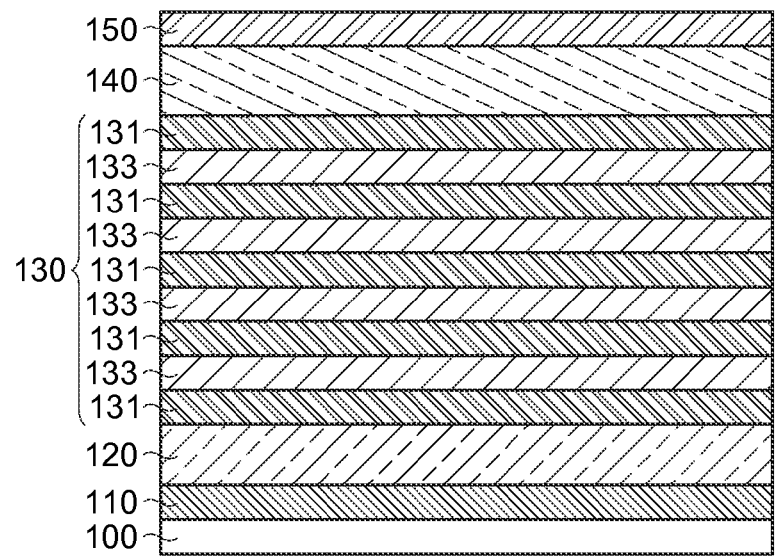
FIG. 2A to FIG. 2F schematically illustrate a method for manufacturing a semiconductor structure according to another embodiment of the present disclosure.
Figure 2B:
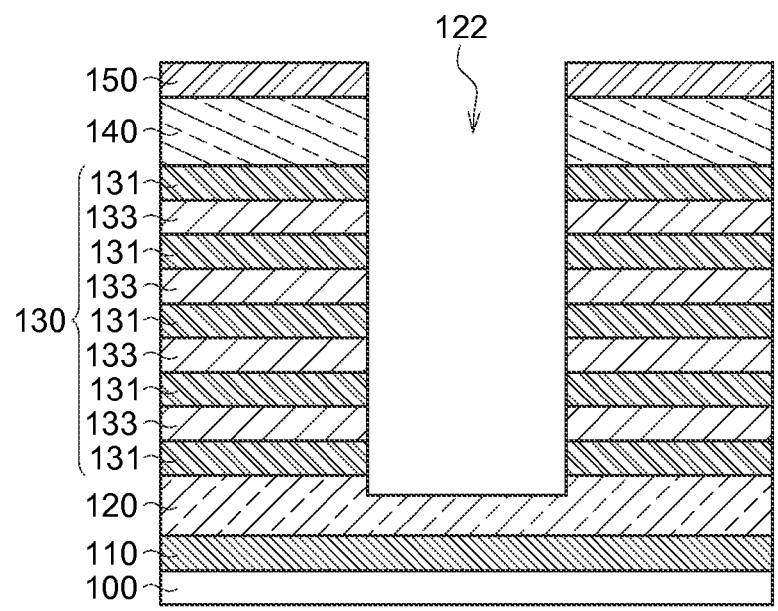
Figure 2C:
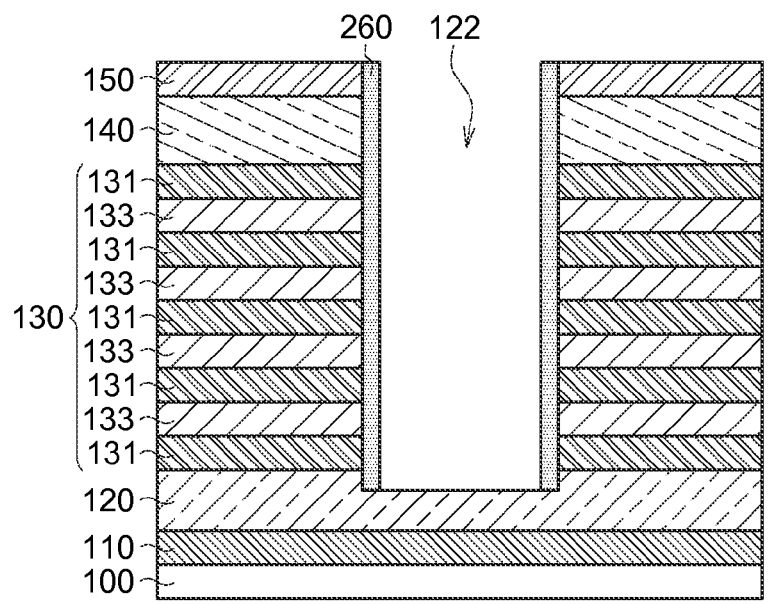

Referring to FIG. 2A to FIG. 2B, the first opening 122 may has been formed. After that, referring to FIG. 2C, a spacer 260 may be formed on a sidewall of the first opening 122. The thickness of the spacer 260 may be in the range of 100 Å to 200 Å. The materials of the spacer 260 may be SiN, SiGe or Ge. In one embodiment, the spacer 260 may be formed by a deposition process.

Figure 2D:
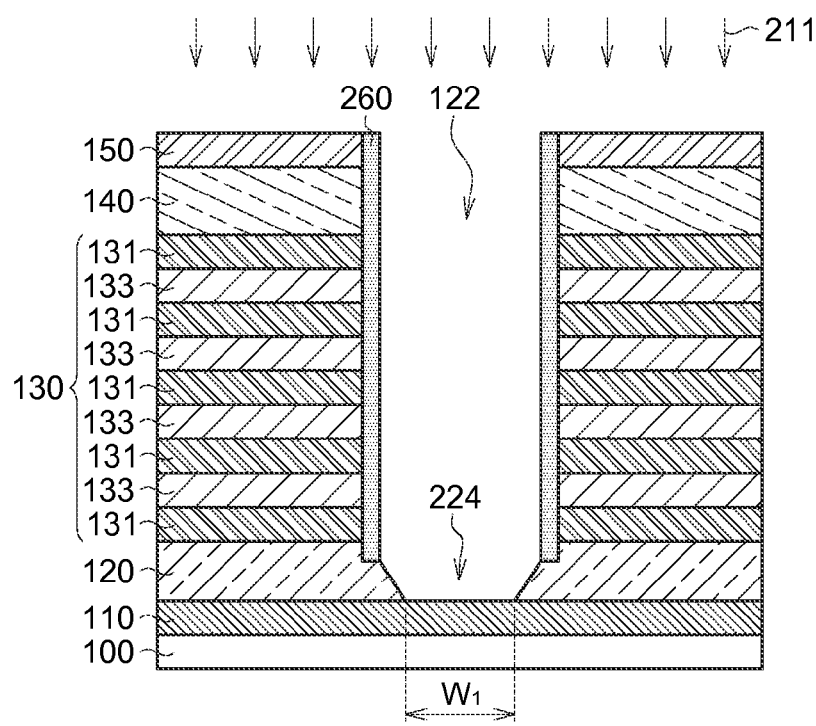

Referring to FIG. 2D, an etching process 211 may be applied to the first opening 122 before applying a first etchant 113, and a trench 224 may be formed in the buffer layer 120. The etching process 211 may include a dry etching, such as a high selective dry etching. The trench 224 may have a taper profile after the treatment of the etching process 211. The spacer 260 may protect the stack 130 from being damaged by the etching process 211.

Figure 2E:
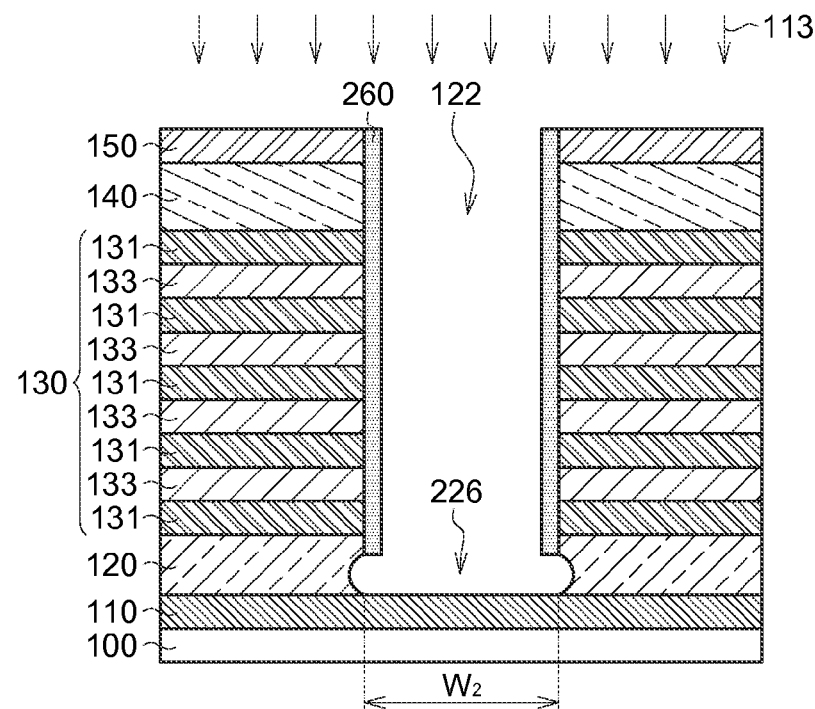

Referring to FIG. 2E, the first etchant 113 may be applied to form a second opening 226 stopped on the buried layer 110. After applying the first etchant 113, the trench 224 may change into the second opening 226. The buffer layer 120 is separated and forms inversion gates 221 by the formation of the second opening 226. At this time, the taper profile of the buffer layer 120 may disappear. Using the first etchant 113, the second opening 226 may be formed by wet etching, such as isotropic etching. The spacer 260 may not be damaged by the first etchant 113, and spacer 260 may protect the stack 130 from being damaged by the first etchant 113. The spacer 260 may be almost intact in base solution.

After applying the etching process 211 to the first opening 122, the buffer layer 120 has a first space (for example, width $W_1$), and after applying the first etchant 113, the buffer layer 120 has a second space (for example, width $W_2$), and the second space is larger than the first space.

Figure 2F:
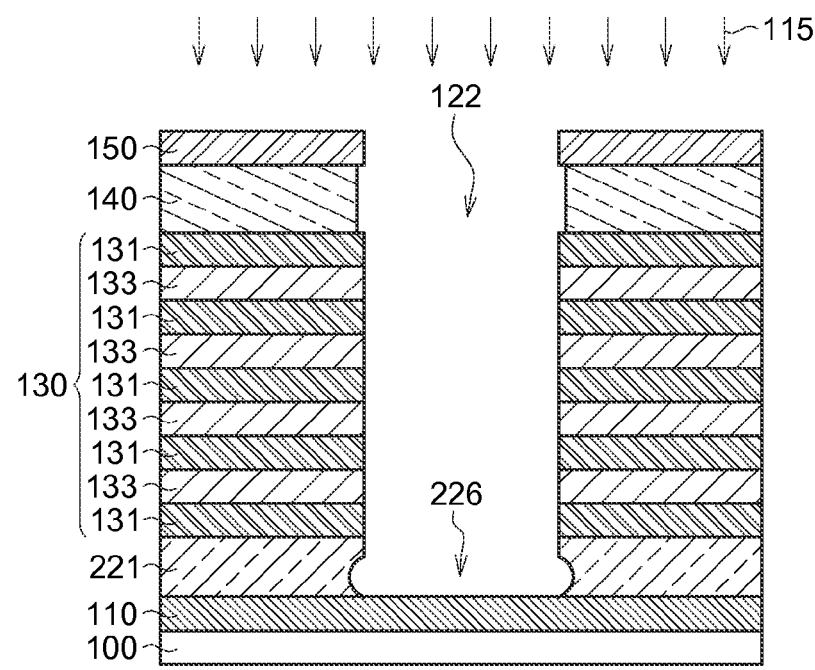

Referring to FIG. 2F, a second etchant 115 may be applied to remove the spacer 260. In some cases, the first hard mask layer 140 may be undercut a little bit by the second etchant 115. The second etchant 115 may be $H_3PO_4$, such as hot $H_3PO_4$.

After removing the spacer 260, as described above, memory layers (not shown) may be formed on the sidewall of the first opening 122 and the second opening 226. Then, a conductor (not shown) may be formed on the memory layer so as to form a channel layer.

According to the embodiments of the present invention, methods for forming a semiconductor structure are provided. By forming the spacer (160 or 260) on the sidewall of the first opening (122), a stack (130) of alternate insulating layers (131) and conductive layers (133) can be protected from a first etchant (113) for forming a second opening (126 or 226), or an etching process (211) for forming a trench (224). Even if the etching process (211) includes a high selective dry etching, the stack (130) is still well protected by the spacer (260). Because the first etchant (113) can etch the buffer layer (120) much faster than the buried layer (110), the buried layer (110) can be almost recess free, and the over-etching can be avoided. Without forming too many recesses in the buried layer (110), the inversion gate (121 or 221) can have a good configuration and thereby a good control ability. Moreover, by using the spacer (160 or 260) and the first etchant (113), larger spaces can be provided to the memory layers and channel materials, and the formation of the channel can be more continuous even though the stack is higher.

In comparison, if no spacer covering the sidewall of the opening of the stack and not using a proper etchant to selectively etch the buffer layer, many recesses may appear in the buried layer, the stack may be damaged by the high selective etching and the inversion gates may have a taper profile. In such a case, the channel region between each inversion gate is not easy to control, and the inversion gate having smaller spaces results in difficulties in filling the memory layers and channel materials, and thereby the channel may become discontinuous.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a semiconductor structure, comprising:
   forming a stack of alternate insulating layers and conductive layers on a buffer layer on a buried layer;
   forming a first opening through the stack and through a portion of the buffer layer;
   forming a spacer on a sidewall of the first opening;
   applying a first etchant to form an second opening stopped on the buried layer; and
   applying a second etchant to remove the spacer, wherein the first etchant has a first etching rate and a second etching rate to the buried layer and the buffer layer respectively, and the second etching rate is higher than the first etching rate.

2. The method according to claim 1, further comprising:
   forming a first hard mask layer on the stack and a second hard mask layer on the first hard mask layer, wherein, in forming the first opening through the stack and through the portion of the buffer layer, the first opening is also through the first hard mask layer and the second hard mask layer.

3. The method according to claim 1, further comprising: before applying the first etchant, applying an etching process to the first opening, wherein the etching process comprises a dry etching.

4. The method according to claim 3, wherein after applying the etching process to the first opening, the buffer layer has a first space, and after applying the first etchant, the buffer layer has a second space, and the second space is larger than the first space.

5. The method according to claim 1, wherein the first etchant comprises ammonium (NH4OH) or tetramethylammonium hydroxide (TMAH).

6. The method according to claim 1, wherein the second etchant is H3PO4.

7. The method according to claim 1, wherein the buffer layer has a thickness greater than the conductive layers.

8. The method according to claim 1, wherein the thickness of the buffer layer is in the range of 1500 Å to 2000 Å.

9. The method according to claim 1, wherein the thickness of the spacer is in the range of 300 Å to 400 Å.

10. The method according to claim 1, wherein the thickness of the spacer is in the range of 100 Å to 200 Å.

11. The method according to claim 1, wherein materials of the spacer comprise SiN, SiGe or Ge.

12. The method according to claim 1, wherein the conductive layers comprises p-type doped poly-silicon.

13. The method according to claim 1, wherein the buffer layer comprises n-type doped poly-silicon.

14. The method according to claim 1, wherein the insulating layers are oxide layers, and the buried layer is an oxide layer.

15. The method according to claim 1, wherein the semiconductor structure is applied to a U turn type of a single gate vertical channel 3D NAND memory.

* * * * *